United States Patent
Wang et al.

(10) Patent No.: US 10,769,984 B2
(45) Date of Patent: Sep. 8, 2020

(54) DISPLAY DEVICE AND DRIVING METHOD THEREOF

(71) Applicants: Beijing BOE Display Technology Co., Ltd., Beijing (CN); BOE Technology Group Co., Ltd., Beijing (CN)

(72) Inventors: Yanfeng Wang, Beijing (CN); Xue Dong, Beijing (CN); Dan Wang, Beijing (CN); Yun Qiu, Beijing (CN); Yuanxin Du, Beijing (CN); Xiaoling Xu, Beijing (CN); Zhenhua Lv, Beijing (CN); Zhidong Wang, Beijing (CN); Weipin Hu, Beijing (CN); Congcong Wei, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/301,292

(22) PCT Filed: Apr. 18, 2018

(86) PCT No.: PCT/CN2018/083527
§ 371 (c)(1),
(2) Date: Nov. 13, 2018

(87) PCT Pub. No.: WO2018/228047
PCT Pub. Date: Dec. 20, 2018

(65) Prior Publication Data
US 2019/0355295 A1   Nov. 21, 2019

(30) Foreign Application Priority Data

Jun. 15, 2017  (CN) .......................... 2017 1 0452349

(51) Int. Cl.
G09G 3/32 (2016.01)
H01L 27/15 (2006.01)
H01L 33/58 (2010.01)

(52) U.S. Cl.
CPC ............. *G09G 3/32* (2013.01); *H01L 27/156* (2013.01); *H01L 33/58* (2013.01); *G09G 2310/0264* (2013.01)

(58) Field of Classification Search
CPC ......... H01L 27/156; H01L 33/58; G09G 3/32; G09G 2310/0264
See application file for complete search history.

(56) References Cited

U.S. PATENT DOCUMENTS

| 4,956,683 A * | 9/1990 | Quintana .............. H01L 27/156 |
| | | 257/544 |
| 6,277,523 B1 * | 8/2001 | Giron .................... G02F 1/1525 |
| | | 429/304 |

(Continued)

FOREIGN PATENT DOCUMENTS

| CN | 102368374 | 3/2012 |
| CN | 104094422 | 10/2014 |

(Continued)

OTHER PUBLICATIONS

International Search Report and Written Opinion of the International Searching Authority corresponding to International Patent Application No. PCT/CN2018/083527 dated Jun. 27, 2013. (16 pages with English translation).

(Continued)

*Primary Examiner* — Christopher E Leiby
(74) *Attorney, Agent, or Firm* — Myers Bigel, P.A.

(57) ABSTRACT

A display device including a display panel that includes a plurality of micro-LED pixel units arranged in an array, and a light-controlling component disposed on a light exiting side of the display panel. The light-controlling component (Continued)

includes a plurality of light-controlling regions each including at least two sub-regions individually controllable to switch between a transmissive state and a non-transmissive state. The light-controlling regions are arranged such that an orthographic projection of each of the light-controlling regions on the display panel covers a respective one of the micro-LED pixel units.

15 Claims, 5 Drawing Sheets

(56) References Cited

U.S. PATENT DOCUMENTS

| | | | |
|---|---|---|---|
| 10,456,573 B1* | 10/2019 | Feinstein | A61B 5/02 |
| 2013/0130440 A1 | 5/2013 | Hu et al. | |
| 2016/0141332 A1* | 5/2016 | Vaufrey | H01L 27/156 |
| | | | 257/88 |
| 2016/0358541 A1 | 12/2016 | Li et al. | |
| 2017/0062400 A1 | 3/2017 | Li et al. | |
| 2017/0084572 A1 | 3/2017 | Liu et al. | |
| 2017/0133818 A1 | 5/2017 | Cok | |
| 2017/0162553 A1 | 6/2017 | Bibl et al. | |
| 2017/0373122 A1 | 12/2017 | Chen | |
| 2018/0203245 A1 | 7/2018 | Chen | |
| 2018/0206298 A1 | 7/2018 | Chen | |
| 2018/0294254 A1 | 10/2018 | Chen et al. | |
| 2019/0079306 A1 | 3/2019 | Wang et al. | |

FOREIGN PATENT DOCUMENTS

| | | |
|---|---|---|
| CN | 104599604 | 5/2015 |
| CN | 104795434 | 7/2015 |
| CN | 105911709 | 8/2016 |
| CN | 105976725 | 9/2016 |
| CN | 106097900 | 11/2016 |
| CN | 106646904 | 5/2017 |
| CN | 106707533 | 5/2017 |
| CN | 106782128 | 5/2017 |
| CN | 106848026 | 6/2017 |
| CN | 106997745 | 8/2017 |
| WO | 2012067037 | 5/2012 |

OTHER PUBLICATIONS

First Chinese Office Action corresponding to Chinese Patent Application No. 201710452349.2 dated Sep. 9, 2018. (11 pages with English translation).

Second Chinese Office Action corresponding to Chinese Patent Application No. 20171045349.2 dated Jan. 25, 2019. (16 pages with English translation).

Third Chinese Office Action corresponding to Chinese Patent Application No. 201710452349.2 dated Mar. 22. 2019. (18 pages with English translation).

* cited by examiner

DISPLAY DEVICE AND DRIVING METHOD THEREOF

CROSS-REFERENCE TO RELATED APPLICATIONS

The present application is a 35 U.S.C. 371 national stage application of PCT International Application No. PCT/CN2018/083527, filed on Apr. 18, 2018, which claims the benefit of Chinese patent application No. 201710452349.2, filed on Jun. 15, 2017, the contents of which are incorporated herein by reference in their entireties.

TECHNICAL FIELD

The present disclosure relates to the field of display technologies, and more particularly to a display device and a method of driving the display device.

BACKGROUND

With the development of display technology, liquid crystal display panels (LCDs), organic light-emitting diode (OLED) display panels, and so-called micro-LED display panels have appeared on the market. Similar to the OLED display panel, a pixel unit in a micro-LED display panel also has a light-emitting layer containing a self-luminous material, except that the self-luminous material is generally in form of quantum wells. Due to the physical limitations, increasing the resolution by reducing the physical size of the pixel units may be difficult for micro-LED display panels.

SUMMARY

According to an aspect of the present disclosure, a display device is provided comprising: a display panel comprising a plurality of micro-LED pixel units arranged in an array; and a light-controlling component disposed on a light exiting side of the display panel, the light-controlling component comprising a plurality of light-controlling regions each comprising at least two sub-regions individually controllable to switch between a transmissive state and a non-transmissive state. The light-controlling regions are arranged such that an orthographic projection of each of the light-controlling regions on the display panel covers a respective one of the micro-LED pixel units.

In some exemplary embodiments, within each of the light-controlling regions the sub-regions are arranged in a lateral direction, a longitudinal direction, or an array.

In some exemplary embodiments, the sub-regions of the light-controlling regions have a same size.

In some exemplary embodiments, the light-controlling component comprises: a first substrate; a second substrate disposed opposite to the first substrate; an electrically controllable optical medium layer disposed between the first substrate and the second substrate; a first electrode layer disposed on a side of the first substrate facing the second substrate; and a second electrode layer disposed on a side of the second substrate facing the first substrate. At least one of the first electrode layer or the second electrode layer comprises a plurality of electrodes disposed within respective ones of the sub-regions of the light-controlling regions, the electrodes disposed within each of the light-controlling regions being individually controllable.

In some exemplary embodiments, the first electrode layer and the second electrode layer each comprise the plurality of electrodes, and the first electrode layer and the second electrode layer have a same electrode pattern.

In some exemplary embodiments, the first electrode layer comprises the plurality of electrodes, and the second electrode layer comprises at least one block electrode each covering at least one of the light-controlling regions.

In some exemplary embodiments, the second electrode layer comprises the plurality of electrodes, and the first electrode layer comprises at least one block electrode each covering at least one of the light-controlling regions.

In some exemplary embodiments, each of the plurality of electrodes comprises a plurality of sub-electrodes.

In some exemplary embodiments, the electrically controllable optical medium layer comprises at least one of an electrochromic material or a ferroelectric liquid crystal material.

In some exemplary embodiments, the light-controlling component is configured such that the sub-regions of each of the light-controlling regions are sequentially switched to the transmission state within successive time windows to transmit light emitted by the respective micro-LED pixel unit, and within each of the time windows only one of the sub-regions of each of the light-controlling regions is in the transmissive state.

In some exemplary embodiments, the orthographic projection of each of the light-controlling regions on the display panel further covers a surrounding region of the respective micro-LED pixel unit.

In some exemplary embodiments, the light-controlling regions do not overlap each other.

According to another aspect of the present disclosure, a method of driving a display device is provided. The display device comprises: a display panel comprising a plurality of micro-LED pixel units arranged in an array; and a light-controlling component disposed on a light exiting side of the display panel, the light-controlling component comprising a plurality of light-controlling regions each comprising at least two sub-regions individually controllable to switch between a transmissive state and a non-transmissive state. The light-controlling regions are arranged such that an orthographic projection of each of the light-controlling regions on the display panel covers a respective one of the micro-LED pixel units. The method comprises sequentially switching within successive time windows the sub-regions of each of the light-controlling regions to the transmissive state to transmit light emitted by the respective micro-LED pixel unit. Within each of the time windows only one of the sub-regions of each of the light-controlling regions is in the transmissive state.

In some exemplary embodiments, the light-controlling component comprises: a first substrate; a second substrate disposed opposite to the first substrate; an electrically controllable optical medium layer disposed between the first substrate and the second substrate; a first electrode layer disposed on a side of the first substrate facing the second substrate; and a second electrode layer disposed on a side of the second substrate facing the first substrate. One of the first electrode layer and the second electrode layer comprises a plurality of electrodes disposed within respective ones of the sub-regions of the light-controlling regions, the electrodes disposed within each of the light-controlling regions being individually controllable. The switching comprises selectively applying, within each of the time windows, a drive voltage to the individually controllable electrodes disposed within each of the light-controlling regions.

In some exemplary embodiments, the applying comprises applying the drive voltage to one of the individually controllable electrodes disposed within each of the light-controlling regions while not applying the drive voltage to remaining ones of the individually controllable electrodes, to switch the sub-region where the electrode applied with the drive voltage is disposed to the transmissive state.

In some exemplary embodiments, the applying comprises not applying the drive voltage to one of the individually controllable electrodes disposed within each of the light-controlling regions while applying the drive voltage to remaining ones of the individually controllable electrodes, to switch the sub-region where the electrode not applied with the drive voltage is disposed to the transmissive state.

These and other aspects of the present disclosure will be apparent from and elucidated with reference to the embodiment(s) described hereinafter.

DETAILED DESCRIPTION

Figure 1:
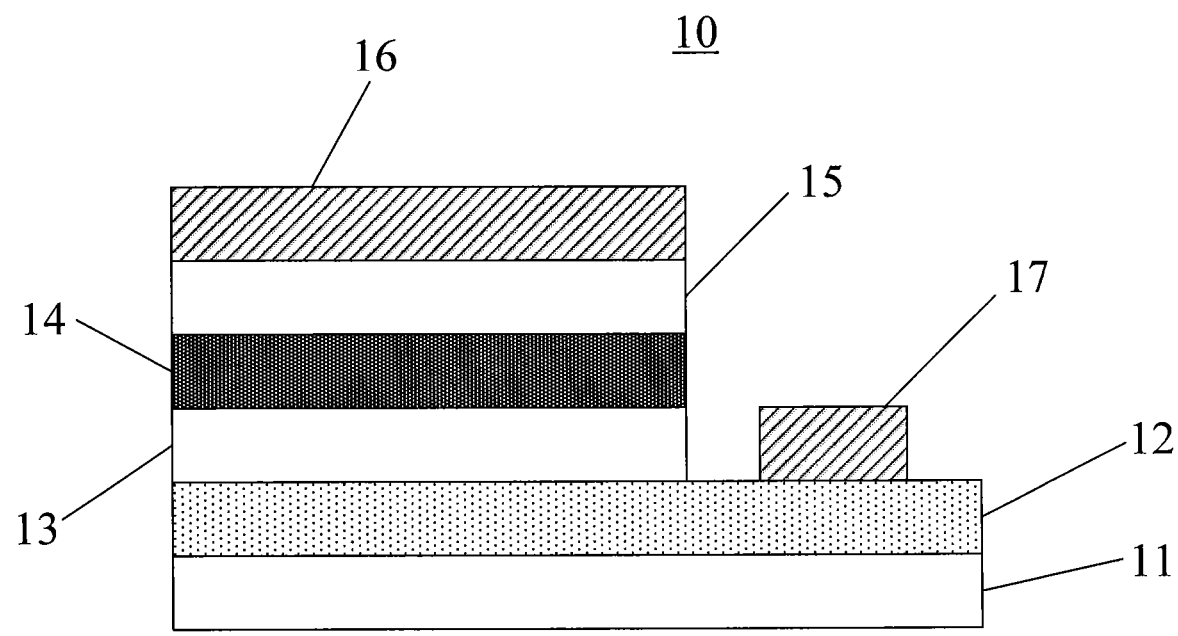
FIG. 1 is a schematic cross-sectional view of a typical micro-LED pixel unit.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "lateral", "longitudinal", "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. Terms such as "before" or "preceding" and "after" or "followed by" may be similarly used, for example, to indicate an order in which light passes through the elements. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. In no event, however, should "on" or "directly on" be construed as requiring a layer to completely cover an underlying layer.

Embodiments of the disclosure are described herein with reference to schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a schematic cross-sectional view of a typical micro-LED 10. As shown in FIG. 1, N-type gallium nitride 12 is grown on an aluminium oxide substrate 11, then quantum wells 13, P-type gallium nitride 14, gallium-doped zinc oxide 15 and a first electrode 16 are sequentially grown on the N-type gallium nitrides 12, and then a second electrode 17 is disposed at an exposed end of the n-type gallium nitride 12, thereby forming the micro-LED 10. The micro-LED 10 can emit light when an appropriate voltage is applied between the first electrode 16 and the second electrode. The micro-LED 10 typically has a size on the order of 1 to 10 μm, although the disclosure is not limited thereto.

Figure 2:
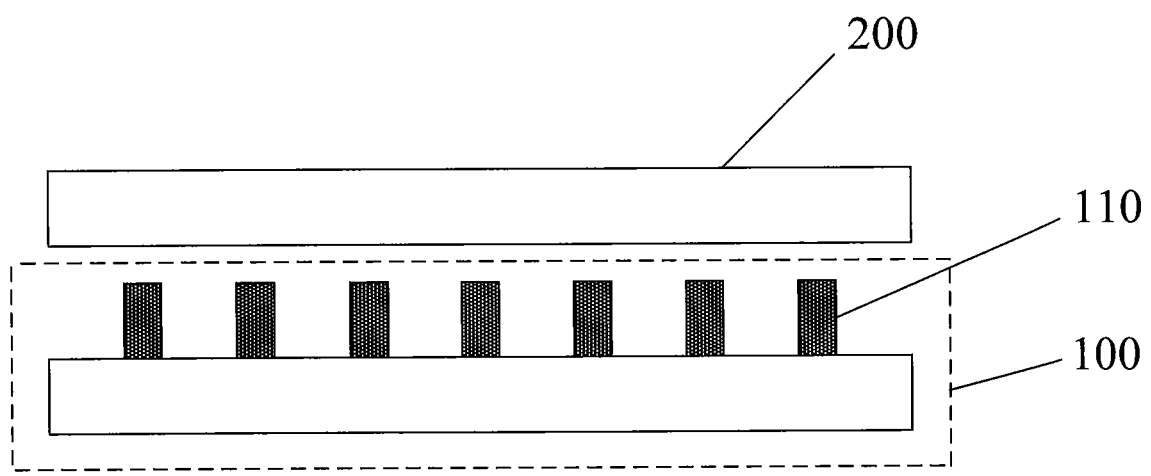
FIG. 2 is a schematic cross-sectional view of a display device according to an embodiment of the present disclosure.

FIG. 2 is a schematic cross-sectional view of a display device in accordance with an embodiment of the present disclosure. As shown in FIG. 2, the display device includes a display panel 100 including a plurality of micro-LED pixel units 110 arranged in an array, and a light-controlling component 200 disposed on a light exiting side of the display panel 100.

Each of the micro-LED pixel units 110 may take the form of the micro-LED 10 shown in FIG. 1, although the disclosure is not limited thereto. The micro-LED pixel units typically need to be fabricated at a temperature above 1000° C. Conventional glass substrates or flexible substrates simply cannot withstand such a high temperature. Thus, the micro-LED pixel units are generally first fabricated on a alumina substrate (which has a melting point of up to 2050° C.) and then transferred to a glass substrate or a flexible polyethylene terephthalate (PET) or polyimide (PI) substrate by transfer printing or other means.

Figure 3:
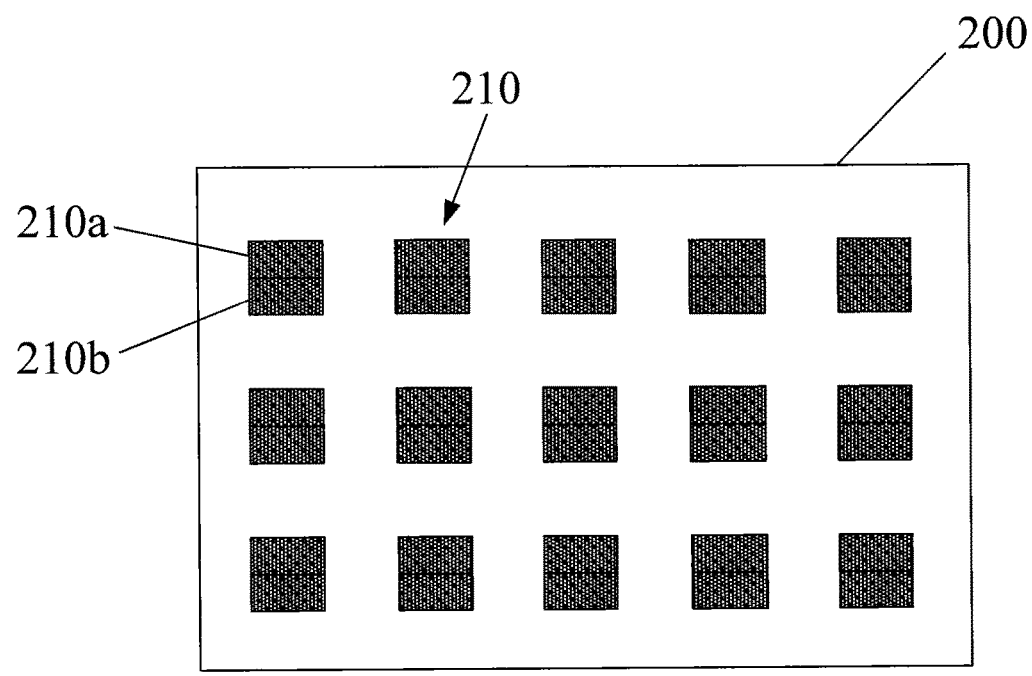
FIGS. 3, 4, 5 and 6 are schematic plan views of the display device shown in FIG. 2.

FIG. 3 is a schematic plan view of the display device shown in FIG. 2. As shown in FIG. 3, the light-controlling component 200 includes a plurality of light-controlling regions 210 (indicated by boxes filled with diagonal lines). Each of the light-controlling regions 210 includes at least two sub-regions (shown as 210a and 210b in FIG. 3) that are individually controllable to switch between a transmissive state and a non-transmissive state. An orthographic projection of each of the light-controlling regions 210 on the display panel 100 covers a respective one of the micro-LED pixel units 110 (indicated by boxes filled with dense black dots) when viewed from above. In the example shown in FIG. 3, each of the light-controlling regions 210 is shown as having an area equal to a cross-sectional area of the respective micro-LED pixel unit 110, i.e., the orthographic projection of the light-controlling region 210 on the display panel 100 completely coincides with an orthographic projection of the LED pixel unit 110 on the display panel 100, although this is not necessary as will be described later.

The light-controlling component 200 may be configured such that the sub-regions 210a and 210b of each of the light-controlling regions 210 are sequentially switched to the transmission state within successive time windows to transmit light emitted by the respective micro-LED pixel unit 110, and only one of the sub-regions 210a and 210b of each of the light-controlling regions 210 is in the transmissive state within each of the time windows. For example, within a first time window, the sub-region 210a is switched to the transmissive state and the sub-region 210b is switched to the non-transmissive state, and then within a second time window immediately after the first time window, the sub-region 210a is switched to the non-transmissive state and the sub-regional device 210b is switched to the transmissive state. This allows for exploitation of the so-called visual persistence effect to increase the resolution of the display device. The visual persistence effect means that when a person is watching an object, the visual image of the object in the human brain will not disappear immediately but will remain for a while even if the light signal from the object is stopped. Based on this effect, each micro-LED pixel unit 110 can be "virtualized" into a plurality of pixel units by means of the switching of the plurality of sub-regions of a corresponding light-controlling region 210, thereby increasing the resolution of the display device. Therefore, a solution is provided for improving the resolution of a display device in a non-physical manner.

It will be understood that the term transmissive state as used herein refers to an state where the associated sub-region of the light-controlling component 200 is capable of transmitting at least a majority (e.g., 90%, 80%, or even 70%) of the light emitted by the corresponding micro-LED pixel unit 110, and that the term non-transmissive state is used with respect to the term transmissive state, which may refer to a state where the associated sub-region of the light-controlling component 200 is completely opaque, or where the associated sub-region of the light-control component 200 is capable of transmitting a small portion (e.g., 5%, 8%, or 10%) of the light emitted by the corresponding micro-LED pixel unit 110.

Although the light-controlling region 210 is illustrated in FIG. 3 as including two sub-regions 210a and 210b arranged in a longitudinal direction, this is merely exemplary and schematic. As will be described later, in other embodiments each of the light-controlling regions 210 may include more sub-regions, and/or the sub-regions of each of the light-controlling regions 210 may be arranged in other manners.

Figure 4:
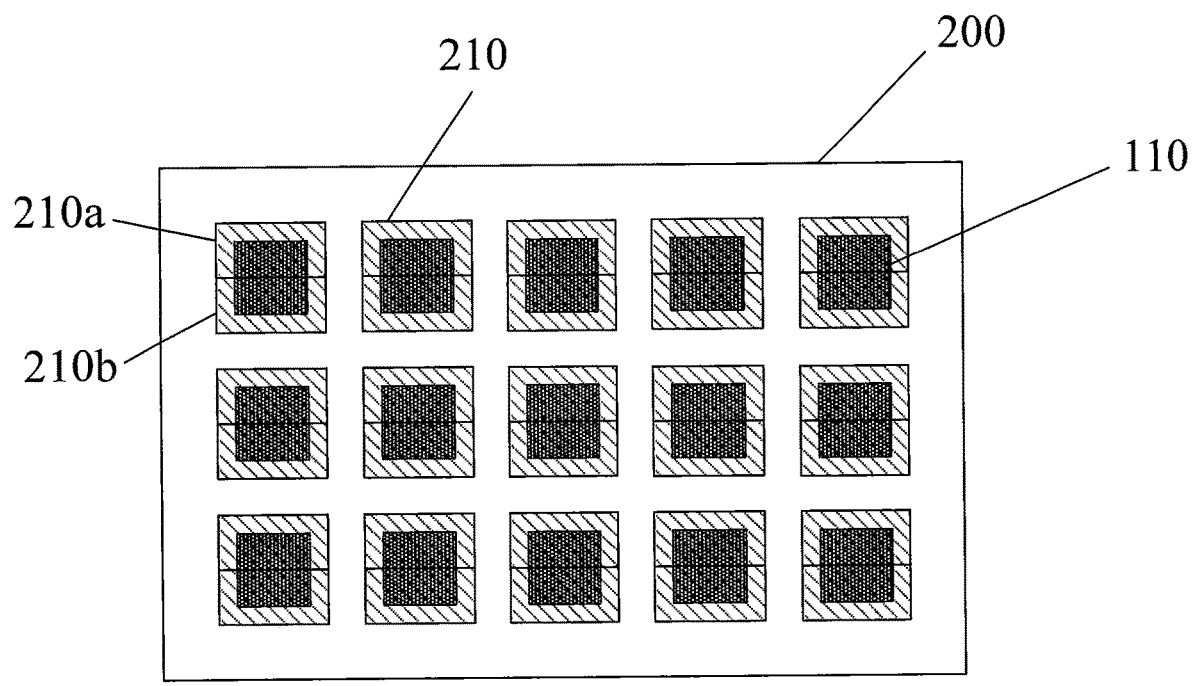

FIG. 4 shows a variation of the display device shown in FIG. 3. As shown in FIG. 4, the area of each light-controlling region 210 may be larger than the cross-sectional area of the corresponding micro-LED pixel unit 110 when viewed from above, that is, the orthographic projection of each light-controlling region 210 on the display panel 100 (not shown in FIG. 4) covers not only the corresponding micro-LED pixel unit 110 but also at least partially covers a gap between adjacent micro-LED pixel units 110. In the example shown in FIG. 4, the light-controlling regions 210 indicated by the boxes filled with diagonal lines cover not only respective micro-LED pixel units 110 indicated by the boxes filled with dense black dots, but also the surrounding regions of the respective micro-LED pixel units 110. This potentially allows the light-controlling region 210 to transmit a greater amount of light emitted by the corresponding micro-LED pixel unit 110, increasing the brightness of the displayed image. In this embodiment, the light-controlling regions 210 do not coincide with each other. This can avoid cross-color interference between adjacent micro-LED pixel units 110.

Figure 5:
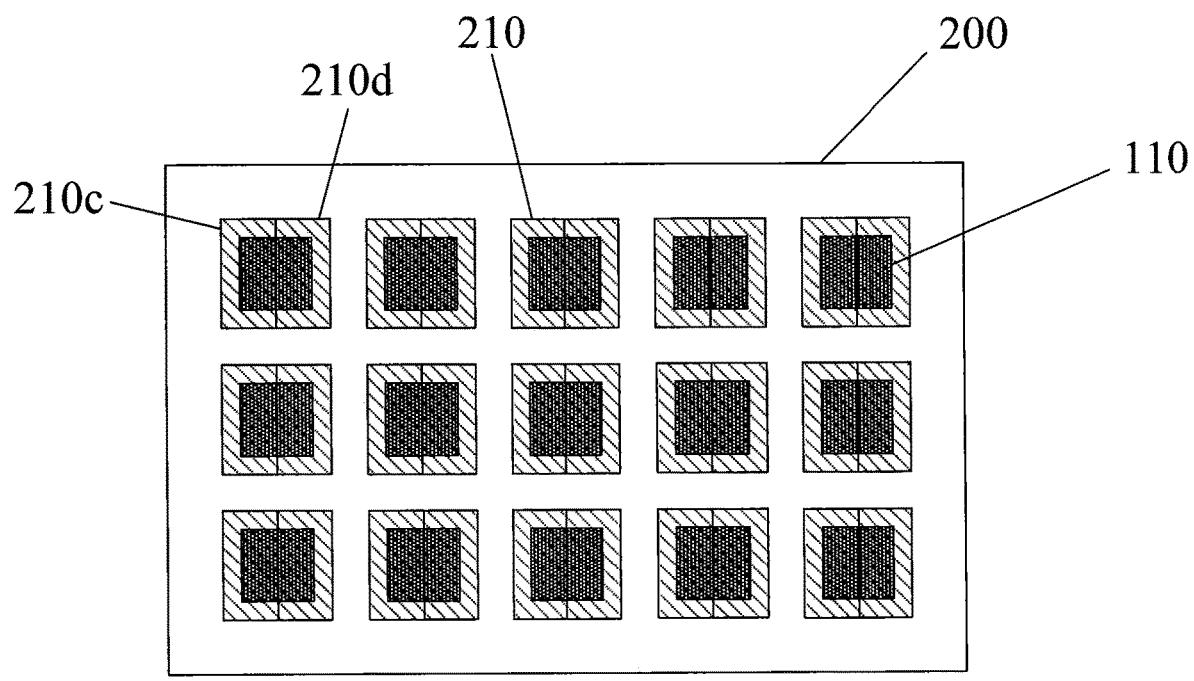

FIG. 5 shows a variation of the display device shown in FIG. 4. As shown in FIG. 5, each of the light-controlling regions 210 includes two sub-regions 210c and 210d arranged in a lateral direction. The number of the sub-regions of each of the light-controlling regions 210 is exemplary. Although not shown, in other embodiments each of the light-controlling regions 210 may include three, four or more sub-regions.

Figure 6:
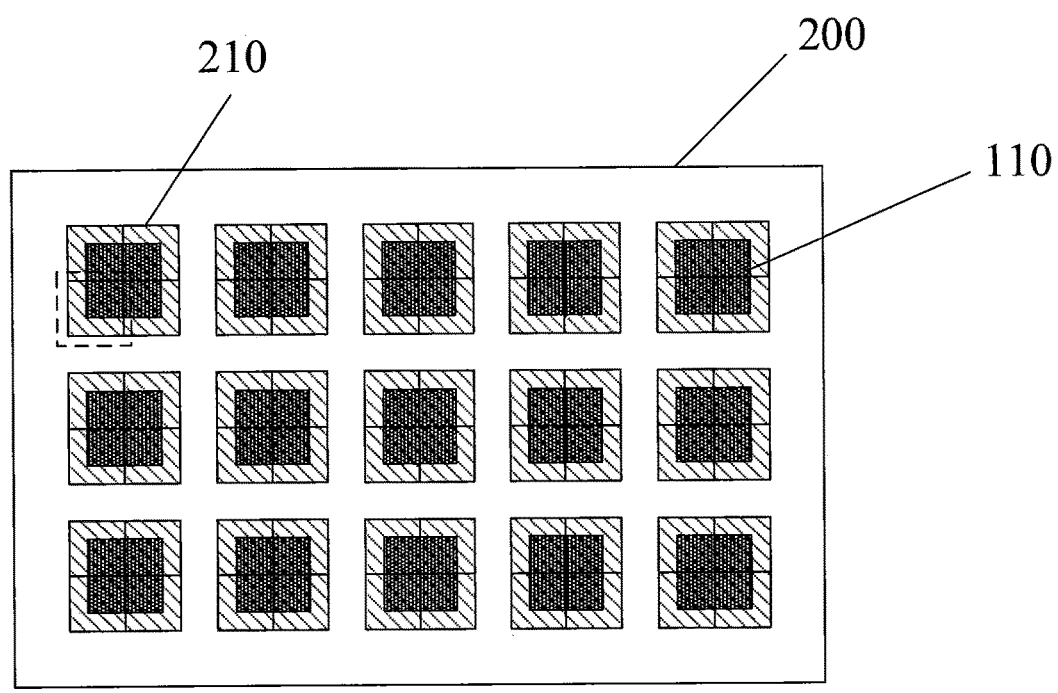

FIG. 6 shows another variation of the display device shown in FIG. 4. As shown in FIG. 6, each of the light-controlling regions 210 includes four sub-regions arranged in an array, and one of the sub-regions of the light-controlling region 210 located at the upper left corner is labelled with a dashed box. The number of the sub-regions included in each of the light-controlling regions 210 is exemplary. Although not shown, in other embodiments each of the light-controlling regions 210 may include, for example, six, nine, or more sub-regions. In the example shown in FIG. 6, the four sub-regions of each of the light-controlling regions 210 are sequentially switched to the transmissive state in successive four time windows to transmit the light emitted by the corresponding micro-LED pixel unit 110.

It will be understood that in embodiments the order in which these sub-regions are switched to the transmissive state is not limited in this disclosure, regardless of how many sub-regions each light-controlling region 210 includes. Due to the loss of light emitted by the micro-LED pixel unit 110 as it passes through the light-controlling region 210, the image displayed by the display device may have a decreased brightness. This can be solved by preprocessing the image data by an image processing unit. In embodiments, the sub-regions of each light-controlling region 210 may have the same size such that they are capable of transmitting an equal amount of light emitted by the corresponding micro-LED pixel unit 110. This enables each "virtual" pixel unit to exhibit the same brightness for the same image data, reducing the amount of computation of the image processing unit when performing the pre-processing. As a result, this facilitates reduction of power consumption while improving the quality of the displayed image.

Figure 7:
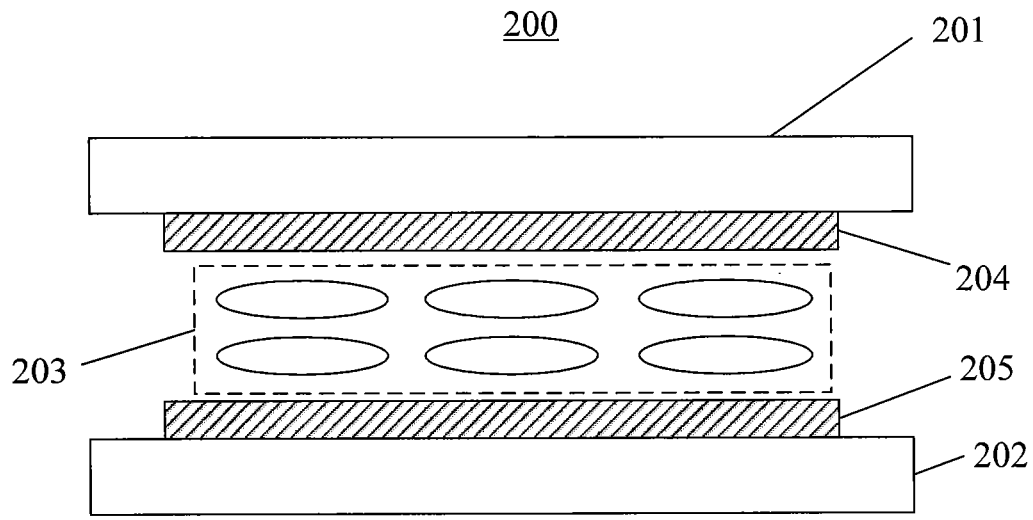
FIG. 7 is a schematic cross-sectional view of a light-controlling component in the display device shown in FIG. 2.

FIG. 7 is a schematic cross-sectional view of the light-controlling component 200 in the display device shown in FIG. 2. As shown in FIG. 7, the light-controlling component 200 includes a first substrate 201, a second substrate 202 disposed opposite to the first substrate 201, an electrically controllable optical medium layer 203 disposed between the first substrate 201 and the second substrate 202, a first electrode layer 204 disposed on a side of the first substrate 201 facing the second substrate 202, and a second electrode layer 205 disposed on a side of the second substrate 202 facing the first substrate 201.

In this embodiment, the electrically controllable optical medium layer 203 may be in a transmissive state or a non-transmissive state depending on an electric field between the first electrode layer 204 and the second electrode layer 205. By way of example and not limitation, the electrically controllable optical medium layer 203 may comprise an electrochromic material and/or a ferroelectric liquid crystal material. In other embodiments, the electrically controllable optical dielectric layer 203 may comprise any other suitable material.

The first substrate 201 and the second substrate 202 may, for example, be made of a transparent material such as, for example, glass, polyethylene terephthalate (PET) or polyimide (PI). The first electrode layer 204 and the second electrode layer 205 may be made of a transparent conductive material such as, for example, indium tin oxide (ITO). The present disclosure is not limited to this.

Figure 8:
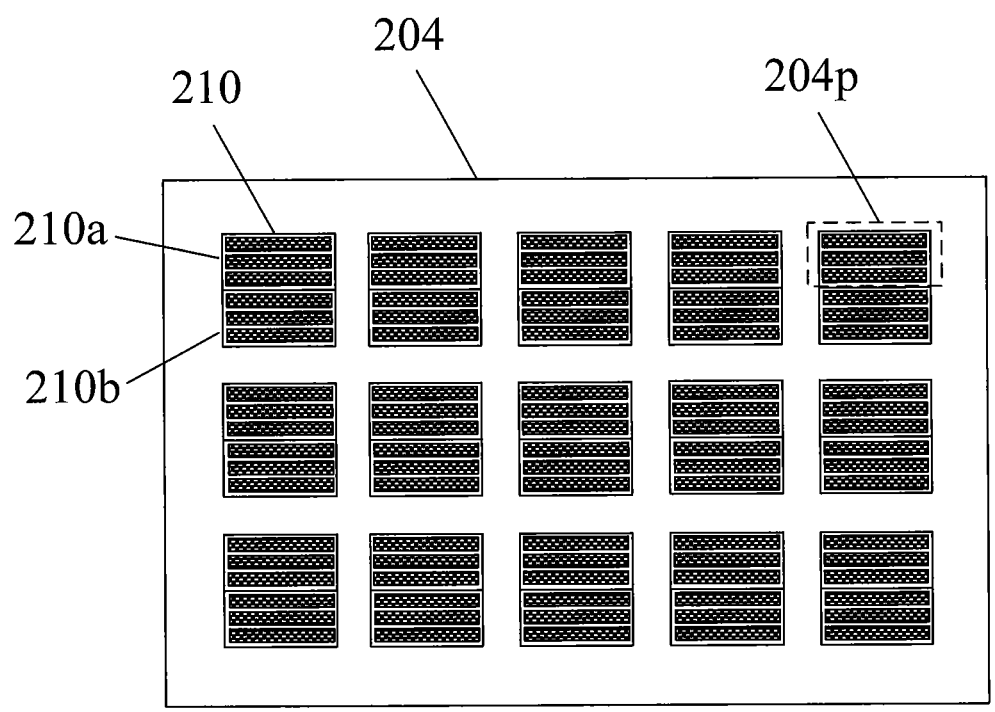
FIG. 8 is a schematic view showing an electrode arrangement of a first electrode layer in the light-controlling component shown in FIG. 7.

FIG. 8 shows an exemplary electrode arrangement for the first electrode layer 204 of the display device shown in FIG. 4. As shown in FIG. 8, the first electrode layer 204 includes a plurality of electrodes 204p (one of which is labelled with a dashed box) disposed within respective ones of the sub-regions of the light-controlling regions 210, with the electrodes 204p disposed within each light-controlling region 210 being individually controllable. For example, for the light-controlling region 210 in the upper right corner, the electrode 204p labelled with a dashed box and another electrode 204p within that light-controlling region 210 are individually controllable. This allows the sub-regions of each light-controlling region 210 (210a and 210b in this example) to be individually switched between a transmissive state and a non-transmissive state. Additionally, in this embodiment each electrode 204p is shown as including three sub-electrodes, each of which is indicated in FIG. 8 by a strip filled with dense grids. Such a sub-electrode arrangement facilitates precise control over the state switching of each sub-region. It will be understood that the sub-electrode arrangement shown in FIG. 8 is exemplary and schematic, and that in other embodiments each electrode 204p may include more or fewer sub-electrodes and/or these sub-electrodes may arranged in other ways.

Figure 9:
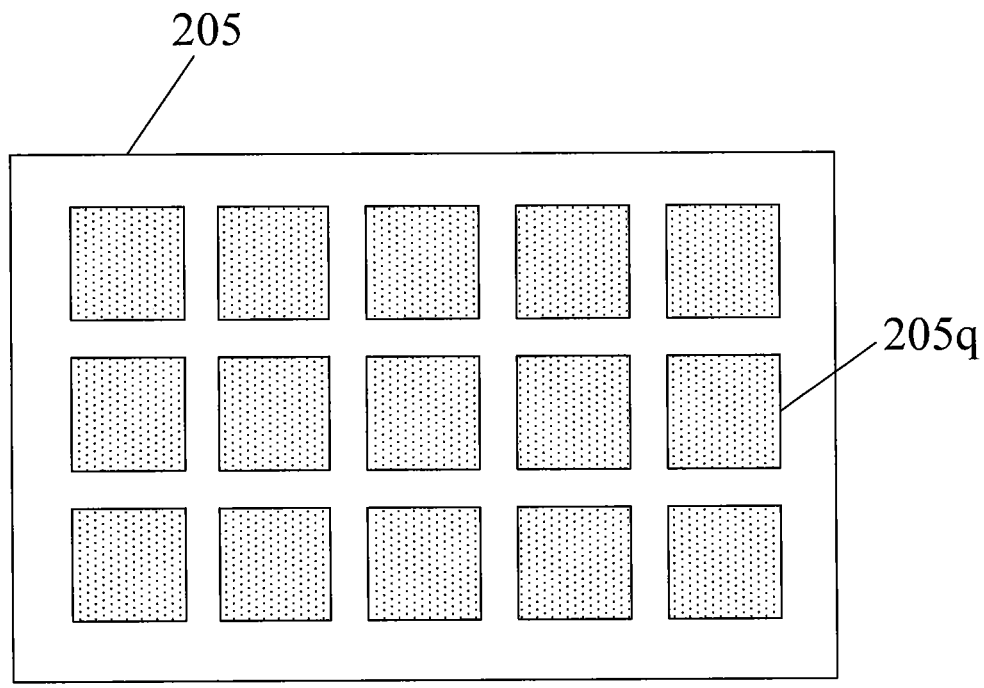
FIG. 9 is a schematic view showing an electrode arrangement of a second electrode layer in the light-controlling component shown in FIG. 7.

FIG. 9 shows an exemplary electrode arrangement of the second electrode layer 205 in the light control component 200 shown in FIG. 7. As shown in FIG. 9, the second electrode layer 205 includes a plurality of block electrodes 205q, and each of the block electrodes 205q covers a respective light-controlling region. Unlike the electrodes 204p shown in FIG. 8, each of the block electrodes 205q is formed as a single piece without including a plurality of sub-electrodes, and thus does not need to be fabricated in a fine pattern. This facilitates simplification of the manufacturing process. It will be understood that although not shown, each of the block electrodes 205q may cover at least one light-controlling region. In some embodiments, the second electrode layer 205 may even include only a single block electrode that covers, for example, the entire second electrode layer 205. Thus, the second electrode layer 205 can be realized by evaporation or sputtering without requiring exposure, etching, and patterning. This facilitates further simplification of the manufacturing process, saving the production cost.

Figure 10:
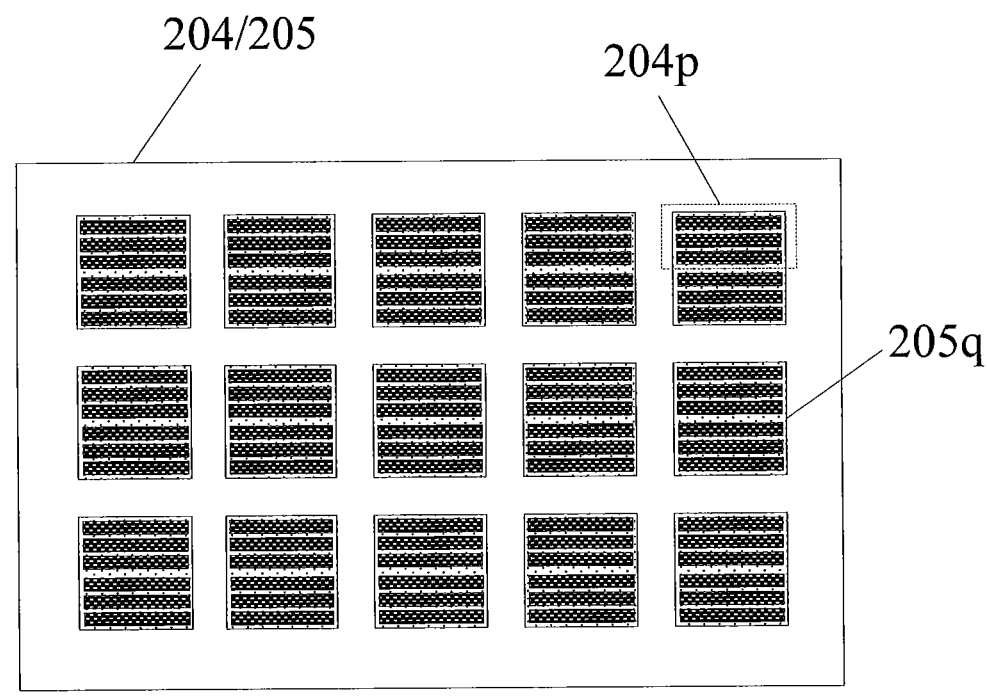
FIG. 10 is a schematic view showing an electrode arrangement of the first electrode layer shown in FIG. 8 and the second electrode layer shown in FIG. 9 when viewed from above.

FIG. 10 shows an electrode arrangement of the first electrode layer 204 shown in FIG. 8 and the second electrode layer 205 shown in FIG. 9 when viewed from above. As shown in FIG. 10, when viewed from above, the plurality of electrodes 204p of the first electrode layer 204 overlap with the plurality of block electrodes 205q of the second electrode layer 205. With such an electrode arrangement, when each of the electrodes 204p is applied with a respective drive voltage and the block electrode 205q is applied with a common voltage, an electric field can be established between each of the electrodes 204p and the corresponding block electrode 205q to control the state switching of the corresponding light-controlling region.

The embodiments described above with respect to FIGS. 8-10 are exemplary and other embodiments are also contemplated. For example, the second electrode layer 205 may also have the same electrode arrangement as the first electrode layer 204, that is, the second electrode layer 205 may have the same electrode pattern as the first electrode layer 204. This allows both the first electrode layer 204 and the second electrode layer 205 to be formed using the same mask, improving manufacturing efficiency. In this case, the state switching of the light-controlling regions can be controlled by applying respective drive voltages to the plurality of electrodes of the second electrode layer 205 and applying a common voltage to the plurality of electrodes of the first electrode layer 204. Alternatively, the electrode arrangements of the first electrode layer 204 and the second electrode layer 205 may be interchanged. That is, the second electrode layer 205 may include the individually controllable electrodes as described above and the first electrode layer 204 may include at least one block electrode as described above.

The sequential switching of the sub-regions of each of the light-controlling regions to the transmissive state can be achieved by selectively applying a drive voltage to the individually controllable electrodes within that light-controlling region. Depending on the electrically controllable optical medium used, switching of each sub-region to the transmissive state can be achieved by applying or not applying a drive voltage to the electrodes corresponding to that sub-region. Where the electrically controllable optical medium transitions to a transmissive state under an external electric field, applying the drive voltage to one of the individually controllable electrodes disposed within a light-controlling region while not applying the drive voltage to remaining ones of the individually controllable electrodes will switch the sub-region in which the electrode applied with the drive voltage is disposed to the transmissive state with the remaining sub-regions of the light-control region being in the non-transmissive state. In contrast, where the electrically controllable optical medium transitions to a non-transmissive state under an external electric field, not applying the drive voltage to one of the individually controllable electrodes disposed in a light-controlling region while applying the drive voltage to remaining ones of the individually controllable electrodes will switch the sub-region in which the electrode not applied with the drive voltage is disposed to the transmissive state with the remaining sub-regions of the light-controlling region being in the non-transmissive state.

While several specific implementation details are contained in the above discussions, these should not be construed as limitations on the scope of any disclosure or of what may be claimed, but rather as descriptions of features that may be specific to particular embodiments of particular disclosures. Certain features that are described in this specification in the context of separate embodiments can also be implemented in combination in a single embodiment. Conversely, various features that are described in the context of a single embodiment can also be implemented in multiple embodiments separately or in any suitable sub-combination.

Various modifications and variations to the described embodiments may be made by those skilled in the art without departing from the scope of the disclosure, from a study of the drawings, the disclosure and the appended claims. Thus, the present disclosure is intended to encompass such modifications and variations if these modifications and variations fall within the scope of the claims of the present disclosure and equivalents thereof.

What is claimed is:

1. A display device, comprising:
    a display panel comprising a plurality of micro-LED pixel units arranged in an array; and
    a light-controlling component on a light exiting side of the plurality of micro-LED pixel units of the display panel, the light-controlling component comprising a plurality of light-controlling regions, ones of the light-controlling regions comprising at least four sub-regions individually controllable to switch between a transmissive state and a non-transmissive state,
    wherein the light-controlling component comprises:
        a first substrate;
        a second substrate opposite to the first substrate;
        an electrically controllable optical medium layer between the first substrate and the second substrate;
        a first electrode layer on a side of the first substrate facing the second substrate; and
        a second electrode layer on a side of the second substrate facing the first substrate,
    wherein at least one of the first electrode layer or the second electrode layer comprises a plurality of electrodes within each sub-region of the at least four sub-regions, wherein the electrodes within each sub-region are individually controllable,
    wherein respective orthographic projections of the ones of the light-controlling regions on the display panel cover respective ones of the micro-LED pixel units and surrounding regions of the respective ones of the micro-LED pixel units, and the light-controlling regions do not overlap each other,
    wherein the electrically controllable optical medium layer comprises ferroelectric liquid crystal material.

2. The display device of claim 1, wherein within the ones of the light-controlling regions the at least four sub-regions are arranged in a lateral direction, a longitudinal direction, or as an array.

3. The display device of claim 2, wherein the at least four sub-regions of the ones of the light-controlling regions have a substantially same size.

4. The display device of claim 1,
    wherein the first electrode layer and the second electrode layer comprise the plurality of electrodes, and
    wherein the first electrode layer and the second electrode layer have a same electrode pattern.

5. The display device of claim 1,
    wherein the first electrode layer comprises the plurality of electrodes, and wherein the second electrode layer comprises at least one block electrode covering at least one of the light-controlling regions.

6. The display device of claim 1,
    wherein the second electrode layer comprises the plurality of electrodes, and
    wherein the first electrode layer comprises at least one block electrode covering at least one of the light-controlling regions.

7. The display device of claim 1, wherein ones of the plurality of electrodes comprise a respective plurality of sub-electrodes.

8. The display device of claim 1,
    wherein the light-controlling component is configured such that the at least four sub-regions of the ones of the light-controlling regions are sequentially switched to the transmissive state within successive time windows to transmit light emitted by the respective ones of the micro-LED pixel units, and
    wherein within respective ones of the successive time windows only one of the at least four sub-regions of the ones of the light-controlling regions is in the transmissive state.

9. A method for driving the display device according to claim 1,
    wherein the method comprises sequentially switching within successive time windows ones of the at least four sub-regions of the light-controlling regions to the transmissive state to transmit light emitted by the respective micro-LED pixel unit,
    wherein within ones of the successive time windows only one of the at least four sub-regions of the light-controlling regions is in the transmissive state.

10. The method of claim 9, wherein the switching comprises:
    selectively applying, within the ones of the successive time windows, a drive voltage to the electrodes within the ones of the light-controlling regions.

11. The method of claim 10, wherein the selectively applying comprises:
    applying the drive voltage to respective ones of the electrodes within the ones of the light-controlling regions while not applying the drive voltage to remaining ones of the electrodes, to switch a sub-region of the at least four sub-regions where the electrode applied with the drive voltage is in the transmissive state.

12. The method of claim 10, wherein the applying comprises:
    not applying the drive voltage to respective ones of the electrodes within the ones of the light-controlling regions while applying the drive voltage to remaining ones of the electrodes, to switch a sub-region of the at least four sub-regions where the electrode not applied with the drive voltage is in the transmissive state.

13. The display device of claim 4, wherein ones of the plurality of electrodes comprise a plurality of sub-electrodes.

14. The display device of claim 5, wherein ones of the plurality of electrodes comprise a plurality of sub-electrodes.

15. The display device of claim 6, wherein ones of the plurality of electrodes comprise a plurality of sub-electrodes.

* * * * *